(12) United States Patent
Kawamoto (10) Patent No.: US 7,777,489 B2
(45) Date of Patent: Aug. 17, 2010

(54) MAGNETIC RESONANCE IMAGING APPARATUS, SHIELD COIL, MANUFACTURING METHOD OF SHIELD COIL, AND DRIVING METHOD OF MAGNETIC RESONANCE IMAGING APPARATUS

(75) Inventor: Hiromi Kawamoto, Yaita (JP)

(73) Assignees: Kabushiki Kaisha Toshiba, Minato-Ku, Tokyo (JP); Toshiba Medical Systems Corporation, Tochigi-Ken, Otawara-Shi (JP)

( * ) Notice: Subject to any disclaimer, the term of this patent is extended or adjusted under 35 U.S.C. 154(b) by 0 days.

(21) Appl. No.: 12/078,710

(22) Filed: Apr. 3, 2008

(65) Prior Publication Data
US 2008/0246480 A1    Oct. 9, 2008

(30) Foreign Application Priority Data
Apr. 6, 2007    (JP)    ............................. 2007-100276

(51) Int. Cl.
*G01V 3/00*    (2006.01)
(52) U.S. Cl. ...................................................... 324/318
(58) Field of Classification Search .......... 324/300–322
See application file for complete search history.

(56) References Cited

U.S. PATENT DOCUMENTS

| 4,876,510 A | 10/1989 | Siebold |
| 4,881,035 A | 11/1989 | Siebold |
| 5,289,128 A * | 2/1994 | DeMeester et al. .......... 324/318 |

FOREIGN PATENT DOCUMENTS

| EP | 0 340 860 A1 | 11/1989 |
| EP | 0 681 189 A1 | 11/1995 |
| JP | 5-64872 | 5/1985 |
| JP | 8-84712 | 9/1994 |

OTHER PUBLICATIONS

Extended European Search Report dated Jul. 23, 2008 in EP 08 00 6876.

* cited by examiner

*Primary Examiner*—Brij B Shrivastav
*Assistant Examiner*—Dixomara Vargas
(74) *Attorney, Agent, or Firm*—Nixon & Vanderhye PC (57) ABSTRACT

A passive shim coil is disposed in a magnetic resonance imaging (MRI) apparatus for shielding magnetic flux of a gradient magnetic field at an inner circumference side generated by a gradient coil, and is set at an outer circumference side of the gradient coil. The coil body is formed of a portion including a superconducting material and a portion including a non-superconducting material.

20 Claims, 6 Drawing Sheets

MAGNETIC RESONANCE IMAGING APPARATUS, SHIELD COIL, MANUFACTURING METHOD OF SHIELD COIL, AND DRIVING METHOD OF MAGNETIC RESONANCE IMAGING APPARATUS

This application claims priority to Japanese Patent Application No. 2007-100276 filed 6 Apr. 2007, the entire contents of which are hereby incorporated by reference.

BACKGROUND OF THE INVENTION

1. Field of the Invention

The present invention relates to a shield coil for shielding a magnetic field generated in a magnetic resonance imaging apparatus, a manufacturing method of shield coil, and the like, and, more particularly, to a passive shield coil formed of a superconducting material and a method of manufacturing the passive shield coil, and the like.

2. Description of the Related Art

A medical magnetic resonance imaging (MRI) apparatus uses various types of magnetic field generating coils such as a static field coil for generating a static magnetic field, a shim coil for correcting uniformity of the static magnetic field, a gradient coil for generating a gradient magnetic field to be superimposed to the static magnetic field, an RF coil for transmitting and receiving a radio frequency signal, and the like.

The shim coil, the gradient coil, and the RF coil are disposed in a magnetic field space (for example, cylindrical space) as a diagnosis space formed by the static field coil (for example, superconducting magnet). In this case, ordinarily, the shim coil is disposed at a position nearest to the static field coil, and the gradient coil is disposed at a position next to the static field coil. On the contrary, the RF coil is disposed at a position nearest to an object (patient) under examination placed in the diagnosis space.

A normal conducting shim, a superconducting shim, and a passive shim are often used as the shim coil. Further, a shield type coil is often used as part of the gradient coil to prevent a gradient magnetic field pulse generated according to a pulse sequence from generating an eddy current in a cabinet for supporting the static field coil because image quality is deteriorated by the eddy current. From this point of view, there is an active shield type gradient coil and a passive shield type gradient coil.

The active shield type gradient coil (ASGC) generally includes a main coil for generating a gradient magnetic field pulse having a desired space distribution and a shield coil disposed at the periphery of the main gradient coil. A leakage of the gradient magnetic field pulse, generated by the main coil, to the outside is suppressed by the shield magnetic field generated actively by the shield coil. Accordingly, the gradient magnetic field leaked to the outside of the coil unit is reduced, and thus the influence of the eddy current caused by the leaked magnetic field to imaging can be suppressed.

In contrast, the passive shield type gradient coil includes a main gradient coil for generating a gradient magnetic field pulse having a desired space distribution and a shield body disposed at the periphery of the main coil. The shield body is composed of, for example, a cylindrical member formed of a shield material that is not connected to a current source and thus different from the active type coil, and that shields the gradient magnetic field pulse to reduce leakage of it to the outside.

In general, although the actively shielded gradient coil (ASGC) is better than the passively shielded gradient coil (PSGC) in shield performance, the ASGC has a more complex structure than the PSGC and requires higher accuracy with respect to design and manufacture of the shield coil pattern.

Figure 1:
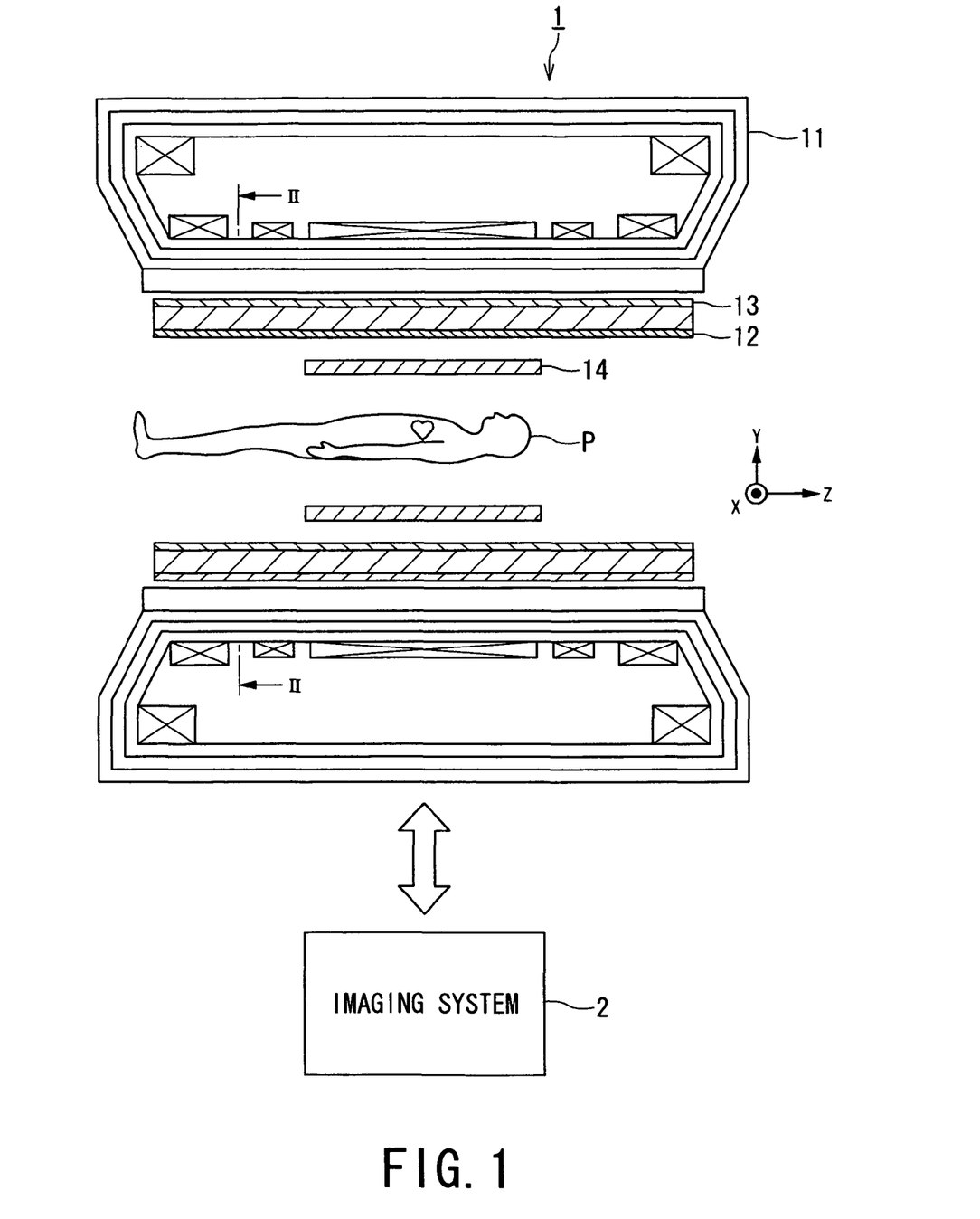
FIG. 1 is a schematic sectional view mainly showing a gantry of a magnetic resonance imaging apparatus according to an embodiment of the present invention.

Recently, a shield disclosed in, for example, Japanese Patent Application Publication No. 8-84712 is known as a shield disposed between a gradient coil and a static field coil. According to the shield structure disclosed in this document, in a magnetic resonance imaging apparatus using a superconducting magnet device, both of a gradient coil and a current supply conducting wire for supplying a current to the coil are covered with a magnetic shield body made of a superconducting multilayered composite body as shown in FIG. 1. With this arrangement, a tapping sound can be reduced which is caused by electromagnetic force generated when a pulse current flows to the gradient coil placed in a static magnetic field and to the current supply conducting wire. Further, according to the arrangement, it may be possible to reduce the leakage of the gradient magnetic field pulse generated by the gradient coil to the outside to thereby reduce an eddy current caused by the leaked magnetic field.

However, since the shield structure disclosed in Japanese Patent Application Publication No. 8-84712 is formed of a superconducting multilayered composite body having a thickness of about 1 [mm] and including a multilayer composed of, for example, NbTi layers (30 layers), Nb layers (60 layers), Cu layers (31 layers), the shield structure is formed as a superconducting sheet having superconducting materials distributed on the entire surface thereof. Accordingly, since the superconducting sheet is exposed to a very strong magnetic field, depending on how an applied static magnetic field is distributed, a shield current flowing to the superconducting material may be saturated by Meissner effect. Accordingly, when the shield current is saturated, the superconducting sheet reaches a critical point in many portions thereof and is placed into a normal conducting state in its entirety due to the heat generated at the time, from which a problem arises in that a desired shield effect cannot be obtained. Further, since the superconducting sheet must be manufactured by laminating materials each composed of a plurality of layers and subjecting the laminated materials to hot rolling and cold rolling, manufacturing cost is very expensive and thus it is difficult to practically use the superconducting sheet in cost-benefit analysis.

SUMMARY OF THE INVENTION

A purpose of the present invention, which was made in view of the shield structure formed of the superconducting multilayered composite body described above, is to provide a magnetic resonance imaging apparatus, a passive type shield coil, a manufacturing method of shield coil, and a driving method of magnetic resonance imaging apparatus suitable for magnetic resonance imaging, which can prevent a deterioration of a shield performance due to Meissner effect even if the shield coil is used to a magnetic resonance imaging apparatus as well as can securely and stably exhibit the shield performance to a desired shield target and can be relatively simply manufactured at a less expensive cost using a smaller amount of superconducting materials, and to a method of manufacturing the passive type shield coil.

To solve the above-described problems, the present invention provides a passive type shield coil, disposed to a magnetic resonance imaging apparatus, for shielding of a magnetic flux of a gradient magnetic field generated at an inner circumference side by a gradient coil for generating the gradient magnetic field, and set at an outer circumference side of the gradient coil, comprising: a coil body formed of a portion including a superconducting material and a portion including a non-superconducting material.

To solve the above-described problems, the present invention provides a driving method of a magnetic resonance imaging apparatus including the shield coil according to claim 1, comprising: a step of generating the static magnetic field by a static magnetic field generating unit including the magnetic resonance imaging apparatus; and a step of shielding of a magnetic flux of the gradient magnetic field in a state of allowing passing a magnetic flux of the static magnetic field generated by the static magnetic field generating unit.

To solve the above-described problems, the present invention provides a manufacturing method of a passive type shield coil for shielding a magnetic field generated from a magnetic field generating coil disposed to a magnetic resonance imaging apparatus, comprising: a step of forming connecting points by electrically connecting adjacent wires of the plurality of wires formed by a superconducting material at predetermined intervals; and a step of forming a sheet-shaped coil body having a plurality of hole portions by laterally extending the plurality of wires.

To solve the above-described problems, the present invention provides a manufacturing method of a passive-type shield coil for shielding a magnetic field generated from a magnetic field generating coil disposed to a magnetic resonance imaging apparatus, comprising: a step of helically winding a wire formed by a superconducting material around a bobbin; and a step of forming a sheet-shaped coil body by helically winding the wire such that it sequentially intersects the wire wound first.

To solve the above-described problems, the present invention provides a magnetic resonance imaging apparatus comprising: a gradient coil configured to generate a gradient magnetic field; and a passive type shield coil formed of a portion including a superconducting material and a portion including no superconducting material, and including a coil body configured to shield of a magnetic flux of the gradient magnetic field generated at an inner circumference side by the gradient coil.

DESCRIPTION OF THE PREFERRED EMBODIMENTS

Embodiments of a shield coil according to the present invention will be explained.

An embodiment of the shield coil according to the present invention will be explained referring to FIGS. 1 to 8. Note that the shield coil is a passive type shield coil which need not be supplied with power and is assembled integrally with a gradient coil so that a passive shield type gradient coil unit is constituted thereby. Since the gradient coil unit is set in a magnetic resonance imaging (MRI) apparatus, the magnetic resonance imaging apparatus will be explained first.

FIG. 1 shows a schematic cross section of a gantry 1 of the magnetic resonance imaging apparatus. The gantry 1 is formed cylindrically in its entirety, and a bore (not shown) in the central portion thereof functions as a diagnosis space. An object (patient) P can be inserted into the bore in diagnosis. The gantry 1 is connected to an imaging system 2 for performing processing such as application of a gradient magnetic field and a radio frequency signal, collection of an echo signal, rearrangement of an image, and the like according to a pulse sequence, thereby magnetic resonance imaging can be performed.

The gantry 1 has a static field coil unit 11 formed in an approximately cylindrical shape, an approximately cylindrical gradient coil unit 12 disposed in the bore of the coil unit 11, a shim coil unit 13 mounted on, for example, the outer peripheral surface of the unit 12, and an RF coil 14 disposed in the bore of the gradient coil unit 12. The patient P is placed on a not shown table-top of a bed system and loosely inserted into the bore (diagnosis space) formed by the RF coil 14.

The static field coil unit 11 is formed of a superconducting magnet. That is, a plurality of heat radiation shield vessels and a single liquid helium vessel are accommodated in an outside vacuum vessel, and the superconducting coil is wound and installed in the liquid helium vessel.

As described above, the gradient coil unit 12 is formed of the passive shield type coil. The coil unit 12 has a coil assembly to each of X-channel, Y-channel, and Z-channel to generate a pulse-like gradient magnetic field in each of X-axis direction, Y-axis direction, and Z-axis direction. Moreover, the gradient coil unit 12 has a passive shield structure in its entirety so that it almost does not leak the gradient magnetic fields of the respective channels to the outside of the unit in the radial direction thereof.

Figure 2:
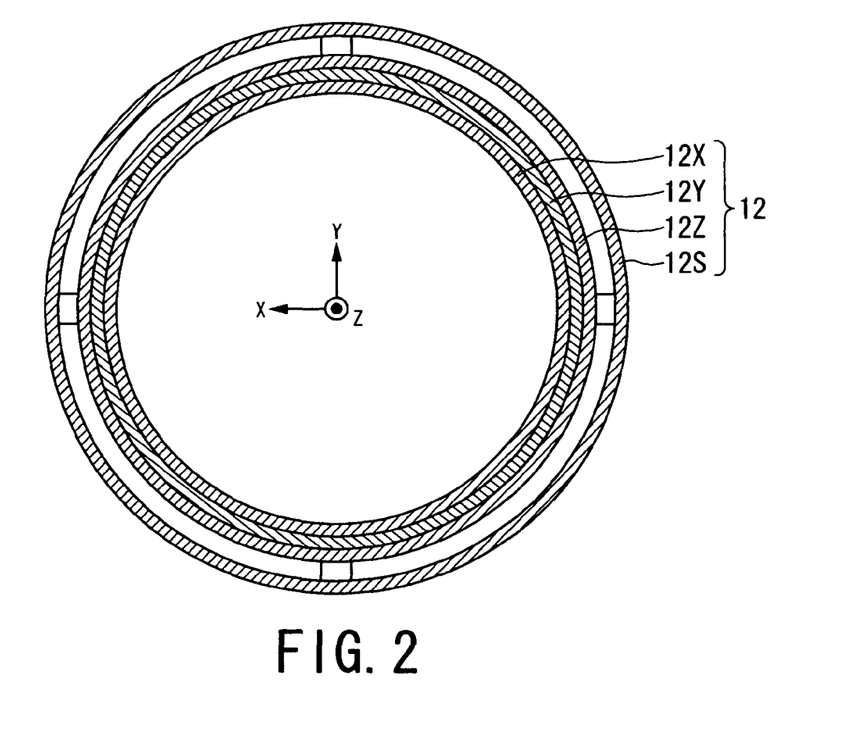
FIG. 2 is a schematic sectional view taken along a line II-II of FIG. 1.

Specifically, in the gradient coil unit 12, each of main coils (gradient coils) 12X, 12Y, and 12Z, formed in the approximately cylindrical shape, of the X-channel, Y-channel, and Z-channel is laminated while being insulated from other coil layers as shown in FIG. 2. Further, a shield coil 12S of one (layer), formed in the approximately cylindrical shape is disposed to the outside of the main coil 12Z as an outermost layer to collectively shield the pulse-like gradient magnetic fields, which are generated by the main coils 12X, 12Y, and 12Z of all the channels, that is, the dynamically changing gradient magnetic fields. In the magnetic resonance imaging apparatus of the embodiment in this way, since the gradient magnetic field changing dynamically generated by the main coils of the X-channel, Y-channel, and Z-channel can be shielded by one shield coil 12S, it can reduce the thickness of the gradient coil unit 12.

Figure 3:
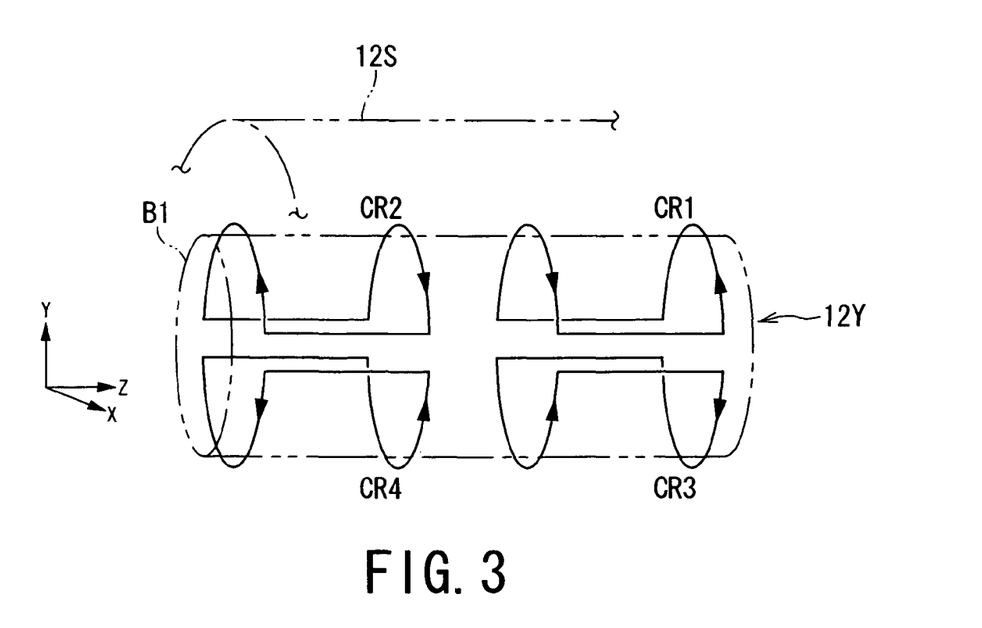
FIG. 3 is a schematic arrangement view of a Y-channel gradient coil.

As shown in FIG. 3, the main coil 12Y of the Y-channel includes four saddle-shaped eddy-like wire-wound portions CR1, CR2, CR3, and CR4 in which flat conductors are wound around a small diameter bobbin B1. The wire-wound portions CR1 and CR2 are disposed side by side in the Z-axis direction as well as electrically connected to each other in series. A pair of the wire-wound portions CR3 and CR4 are disposed in confrontation with each other at the positions which are determined when a pair of wire-wound portions CR1 and CR2 are rotated 180 degrees around a body axis of the bore as a central axis. The directions of the pulse currents, which flow to the respective wire-wound portions, are set as shown by arrows in the figure in the wire-wound portions confronting with each other and in the wire-wound portions disposed side by side so that the magnitude of the gradient magnetic field in the Y-axis direction changes linearly.

Note that FIG. 3 schematically shows one turn of a saddle-shaped winding pattern (wound wire) in a simplified fashion, and each of the wire-wound portions is actually composed of a saddle-shaped coil having a plurality of turns. Further, the bobbin B1 is formed by winding an insulation layer on the wound wire layer of other channel.

The main coil 12X of the X-channel is disposed likewise in a state that the main coil 12Y of the Y-channel is rotated 90 degrees around the body axis of the bore as a central axis.

Figure 4:
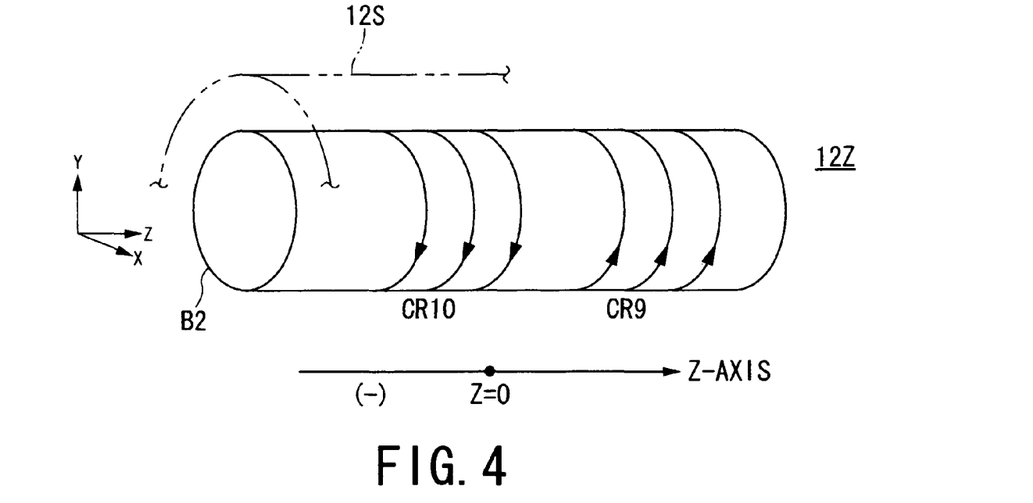
FIG. 4 is a schematic arrangement view of a Z-channel gradient coil.

Further, as schematically shown in FIG. 4, the main coil 12Z of the Z-channel is composed of a flat conductor having a plurality of turns thereof wound around a cylindrical bobbin B2 along a solenoid-shaped coil pattern. The main coil 12Z is wound in an opposite direction from the central position (Z=0) of the Z-axis direction.

Figure 5:
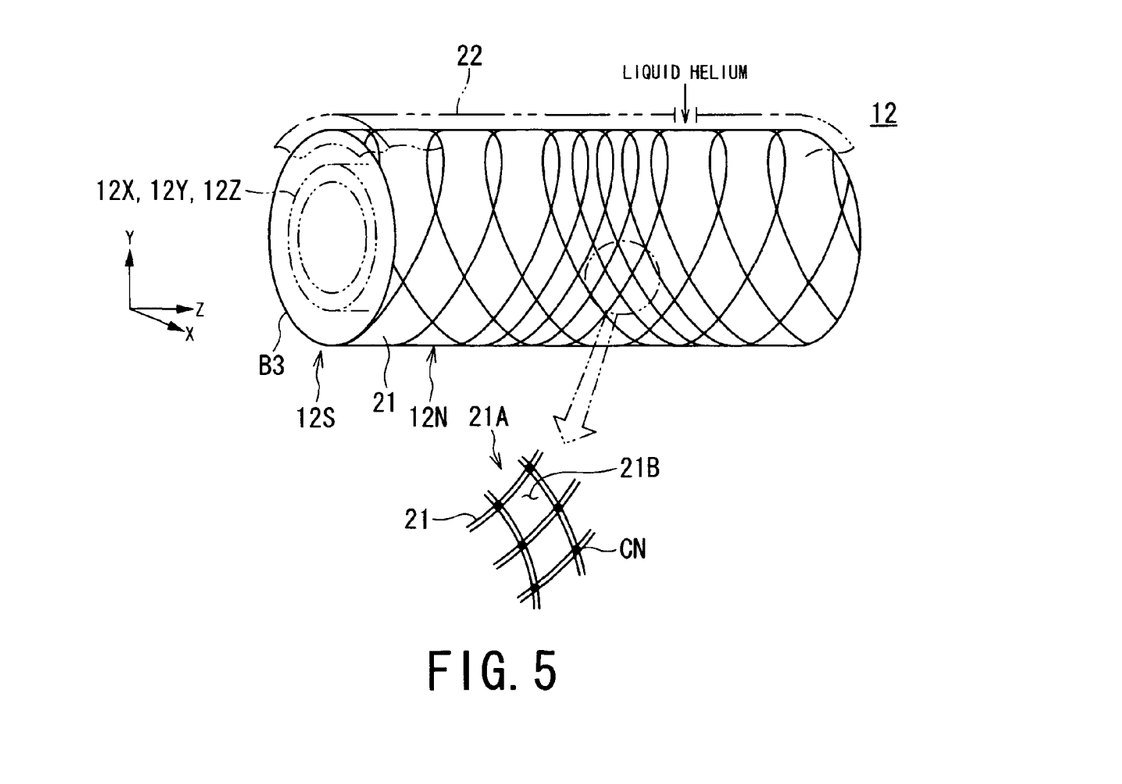
FIG. 5 is a schematic arrangement view of a shield coil common to X-channel, Y-channel, and Z-channel and includes a partial enlarged explanatory view of the shield coil.

The shield coil 12S has a characteristic structure in which the present invention is embodied and forms a passive shield coil formed of a superconducting material. Specifically, as shown in FIG. 5, the shield coil 12S is composed of a mesh-like cylindrical body (coil body) 12N formed using, for example, a superconducting wire 21 composed of NbTi as a superconducting material. That is, the cylindrical body (coil body) 12N has such a simple arrangement that the superconducting wire 21 is assembled along the peripheral surface of the cylindrical body 12N so as to draw a diamond-shaped pattern. Accordingly, the shield coil 12S is composed of a plurality of approximately diamond-shaped frame portions 21A as the substantial coil portion thereof which are composed of a superconductor formed along the peripheral surface thereof. A hole portion (space portion) 21B is formed in the inside of each of the plurality of approximately diamond-shaped frame portions 21A.

That is, the "hole portion" is a portion (region) in which no superconducting material exists. Accordingly, any portion in which no superconducting material exists can be used as the hole portion regardless that the portion is actually a "hole" or not. For example, the "hole portion" may be filled with a material having good heat conductivity and a good electric conductivity such as copper and the like, for example, a normal conducting material. Further, since the "hole portion" may be any portion as long as it has no superconducting material, it may be a very small spatial hole of an atomic-level such as a lattice defect. When a superconducting material, for example, a superconducting sheet having the lattice defect is added with impurities to increase the current density thereof, the superconducting sheet can be made to have a different purpose. Further, when the shield coil according to the present invention is formed as a dynamic shield sheet (which is not necessarily a sheet shape) for generating a small amount of heat, it is preferable that at least the peripheries of the spatial superconducting holes be surrounded by a superconductor. This is because it is desired to flow a shield permanent current to shield the dynamic variation of a magnetic field.

The shield coil according to the present invention, which has the portions without the superconducting material as described above, exhibits a behavior entirely different from a conventional shield coil using a superconducting sheet whose one surface is filled with a superconducting material. Although the behavior is specifically explained later using a drawing, its outline is as described below. In the shield coil according to the present invention, since the portions, in which no superconducting material exists on the spaces thereof are intentionally formed, the shield coil behaves as if no superconducting material exists as to the static magnetic field as well as the shield permanent current is created on the superconducting material to cancel the magnetic flux passing through the holes without the superconducting material as to the dynamic change of the magnetic field so that only the dynamic change of the magnetic field is selectively shield. At the same time, although an eddy current is physically generated on the conductor such as copper and the like filled for the purpose of protecting the superconducting material, the eddy current is instantly absorbed by the superconducting material having an electric resistance of 0 and thus the heat generated by the eddy current is very small.

Like statements above, since the cylindrical body 12N has such a simple arrangement that the superconducting wire 21 is assembled along the peripheral surface of the cylindrical body 12N so as to draw a diamond-shaped pattern, the cylindrical body 12N becomes a shape that does not depend on a coil pattern of the main coils 12X, 12Y, and 12Z, formed in the approximately cylindrical shape, of the X-channel, Y-channel, and Z-channel. Therefore, according to the cylindrical body 12N of the shield coil 12S of the embodiment, it is effective for the to shield the magnetic field generated by the main gradient coils 12X, 12Y, and 12Z after the coil pattern is changed and by mobile main coils, once if the cylindrical body 12N is set.

The shield coil 12S according to the embodiment will be explained again. The shield coil 12S is accommodated in a vessel 22 formed in the approximately cylindrical shape and can be filled with liquid helium to place the superconducting wire 21 in a superconducting state.

Figure 6A:
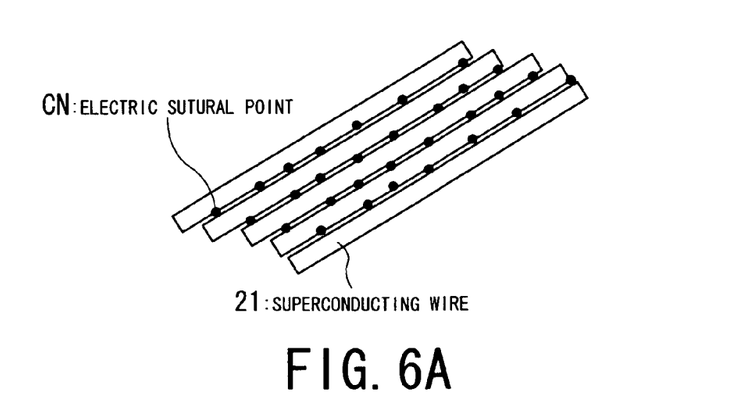
FIGS. 6A and 6B are respectively a view explaining an example of a manufacturing method of shield coil.
Figure 6B:
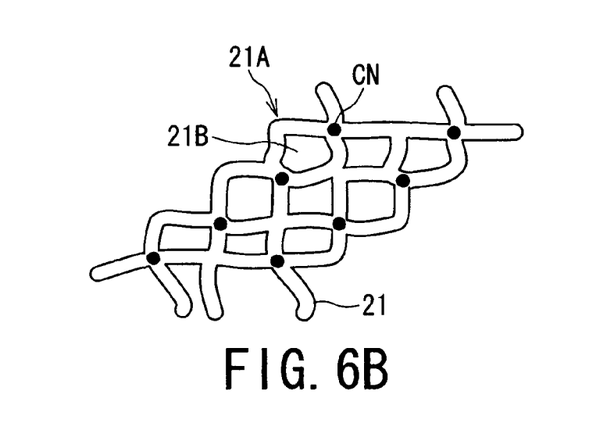
Figure 7:
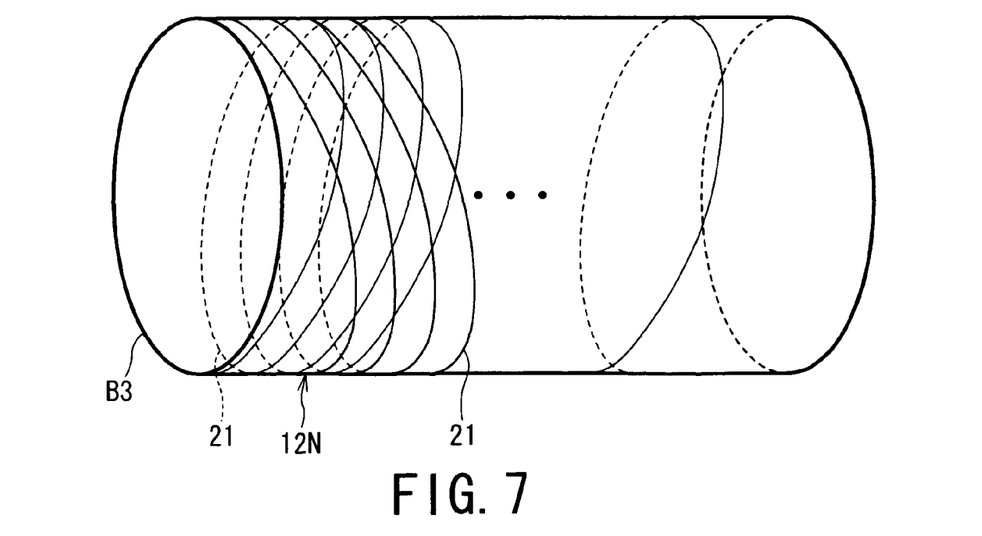
FIG. 7 is a view explaining other example of the manufacturing method of shield coil.

The shield coil 12S can be made by various methods. FIGS. 6A, 6B and 7 show an example of the manufacturing methods. Any of the manufacturing methods uses the superconducting wire 21 having a superconducting material (core material) buried therein along the lengthwise direction thereof which is composed of, for example, an NbTi superconducting material.

In the manufacturing method shown in FIGS. 6A and 6B, a plurality of the superconducting wires 21 are disposed in parallel, and the wires, which are disposed adjacent to each other, are electrically connected to each other at predetermined intervals (formation of electric junction points CN) (refer to FIG. 6A). Next, the wires, to which the plurality of electric joint points CN are formed as described above, are extended so as to draw diamond-shaped patterns (hole portions 21B) each having four electric joint points CN as apexes (refer to FIG. 6B). Next, the extended wires are cylindrically rounded along a cylindrical bobbin B3 (refer to FIG. 5).

Note that, as another example of the manufacturing method, a plurality of lines of cutouts each having a predetermined length may be formed at predetermined intervals to a superconducting sheet, whose surface is entirely composed of a superconducting material, and then the sheet may be laterally spread. With this arrangement, the cutouts are widened, respectively, the hole portions 21B are formed thereby, and the electric joint points CN described above are formed by the portions where the cutouts are connected to each other. As a result, a shield coil 12S, which is similar to that shown in FIG. 6B, can be formed.

In contrast, in the manufacturing method shown in FIG. 7, first, the superconducting wire 21 is helically wound along the peripheral surface of the cylindrical bobbin B3 at an oblique angle. Next, the superconducting wire 21 is helically wound again by changing the winding direction thereof so that it intersects the winding direction of the already wound superconducting wire 21. When the superconducting wire 21 is helically wound twice as described above, the electric joint points described above are formed at the respective positions at which the superconducting wires 21 intersect along the peripheral surface, and approximately diamond-shaped pattern portions surrounded by the electric joint points CN form the hole portions 21B.

Next, an operation/working effect of the shield coil 12S of the gantry 1 of the magnetic resonance imaging apparatus of the embodiment will be explained.

A purpose of setting of the shield coil 12S is to prevent the leakage of the magnetic field from the gradient coil unit 12 to the direction of the static field coil unit 11 (outside direction of the radius of the gantry 1). For this purpose, it is necessary to shield the pulse-like changing gradient magnetic field (magnetic field that varies dynamically) without exhibiting a shield effect to the static magnetic field. For this purpose, it is important to manage a sequence according to which the static magnetic field is applied when the shield coil 12S (that is, superconducting wire 21) is shifted to a superconducting state. That is, it is important to apply the static magnetic field first and then to shift the shield coil 12 to the superconducting state.

Figure 8:
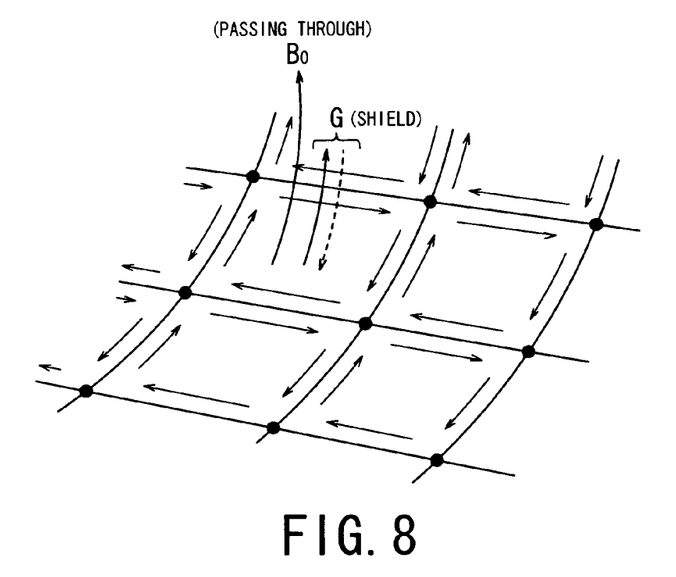
FIG. 8 is a view explaining a shield operation of the shield coil in the embodiment.

Therefore, when a magnetic resonance imaging is executed using the magnetic resonance imaging apparatus, first, the static magnetic field is generated by starting the static field coil unit 11 according to the above the sequence. Since the static magnetic field is generated so as to pass through the inside of the gantry 1, the magnetic flux $B_0$ of the static magnetic field passes through the shield coil 12 as shown in FIG. 8. That is, since the shield coil 12 at the time is not yet placed in the superconducting state, the magnetic flux $B_0$ of the static magnetic field can freely pass though the hole portions 21B.

Next, after the static magnetic field is generated, the shield coil 12 is shifted to the superconducting state. This can be achieved by filling the vessel 22 with liquid helium. With this operation, the shield coil 12 is dipped into the liquid helium in the vessel 22. As a result, since the shield coil 12 is cooled to the ultracold temperature ($-269°$ C.) of the liquid helium, it is shifted to the superconducting state.

Thereafter, the gradient coils (main coils) 12X, 12Y, and 12Z of the X-channel, Y-channel, and Z-channel of the gradient coil unit as well as the RF coil 14 are driven according to the predetermined pulse sequence and echo signals are collected through the RF coil 14.

The gradient coils (main coils) 12X, 12Y, and 12Z are respectively driven by a pulse signal that is turned on and off in a very short time. Accordingly, the gradient magnetic fields G (Gx, Gy, Gz), which are generated from the respective gradient coils 12X, 12Y, and 12Z are superimposed to the static electric field $B_0$ and provide the static electric field $B_0$ with spatial position information. Accordingly, desired echo signals can be collected in the static electric field $B_0$.

The gradient magnetic fields G generated from the respective gradient coils 12X, 12Y, and 12Z are superimposed with the static magnetic field $B_0$ as well as also radiated to the static field coil unit 11 side. The gradient magnetic fields G are dynamically varied as time passes.

Accordingly, the magnetic flux of the gradient magnetic fields G intends to pass through the hole portions 21B of the shield coil 12S because the frame portions 21A of the shield coil 12S are made completely non-magnetic. However, as shown in FIG. 8, since each of the hole portions 21B constitutes one closed-loop, the loop currents induced to the respective closed-loops are cancelled between adjacent loops, and thus no net current flows eventually. That is, although the static magnetic field $B_0$ applied first can pass through the shield coil 12S, the magnetic field which is applied after the shield coil 12S is shifted to the superconducting state, that is, the gradient magnetic fields G cannot pass through the shield coil 12S and are thereby shielded. Accordingly, since the shield coil 12S does not affect the static electric field $B_0$, it does not generate a quench phenomenon by being caused to reach a critical point by the static magnetic field. As a result, the shield coil 12S can obtain a very functional shield effect in that it selectively shields only the gradient magnetic fields G.

Accordingly, the shield coil 12S can securely eliminate or reduce such a circumstance that the gradient magnetic fields G leak to the static field coil unit 11 side, generate an eddy current to the cabinet of the unit 11, and deteriorate the image quality of a rearranged MR image by the eddy current.

Moreover, the passive shield coil 12S according to the embodiment can shield the dynamically variable magnetic fields (gradient magnetic fields) of all the X-, Y-, and Z-channels regardless that it is effectively composed of a shield body of only one layer. That is, all the gradient magnetic fields can be shielded by the one passive shield body regardless of the shape and the winding pattern of the gradient coils 12X, 12Y, and 12Z located to the inside diameter side (bore side) of the shield coil 12S. Accordingly, the shield coil 12S can be used as a general-purpose shield body which is excellent in versatility.

Further, since the shield coil 12S can be applied to the gradient coils used to various purposes and need not be supplied with a current as described above, the shield coil 12S can be disposed in the vessel (vacuum vessel) of the superconducting magnet employed as the static field coil unit 11. When the shield coil 12S is disposed as described above, the distances between it and the gradient coils 12X, 12Y, and 12Z as the main coils can be increased. Accordingly, the capacity of a power supply to the main coils can be reduced and the efficiency of the gradient coil unit 12 can be improved as well as the size thereof can be reduced.

Furthermore, since it is sufficient to use a wire such as the NbTi wire and the like as the superconducting material used to the shield coil 12S, in practical use a very important effect that a cost of the superconducting material can be suppressed, and it is manufactured much less expensively and is achieved by the shield coil 12S being different from the conventional superconducting sheet type shield coil.

Further, although mechanism (vessel 22 and a port for it) is necessary to shift the passive shield coil 12S to the superconducting state, the overall arrangement of the passive type gradient coil unit 12 using the shield coil 12S is simplified and reduced in size when it is considered that only the one shield layer (shield coil 12S) common to the respective channels is necessary and that a power supply and wiring to the shield coil 12S are not necessary is advantageously different from an active type gradient coil unit.

Incidentally, the shield coil 12S according to the embodiment is shifted to the superconducting state after the static magnetic field is generated, the static magnetic field can be caused to continuously pass through the shield coil 12S. In contrast, since the conventional superconducting sheet, in which a superconducting material is distributed on the entire surface thereof, intends to eject a magnetic flux to the outside thereof by the Meissner effect regardless of the sequence used for generating and applying a static magnetic field, the conventional superconducting sheet is definitely different from the superconducting sheet of the embodiment in that the former sheet shields both the static magnetic field and the variable magnetic field.

Note that when the vessel 22 with which liquid helium is filled as described above is not provided, the shield coil 12S may be shifted to the superconducting state using a direct-mounting-type refrigerator and starting it. Accordingly, various modes may be employed as the arrangement for controlling the shield coil 12S from a normal conducting state to the superconducting state.

Other Embodiment

A different embodiment of the shield coil according to the present invention will be explained.

Figure 9:
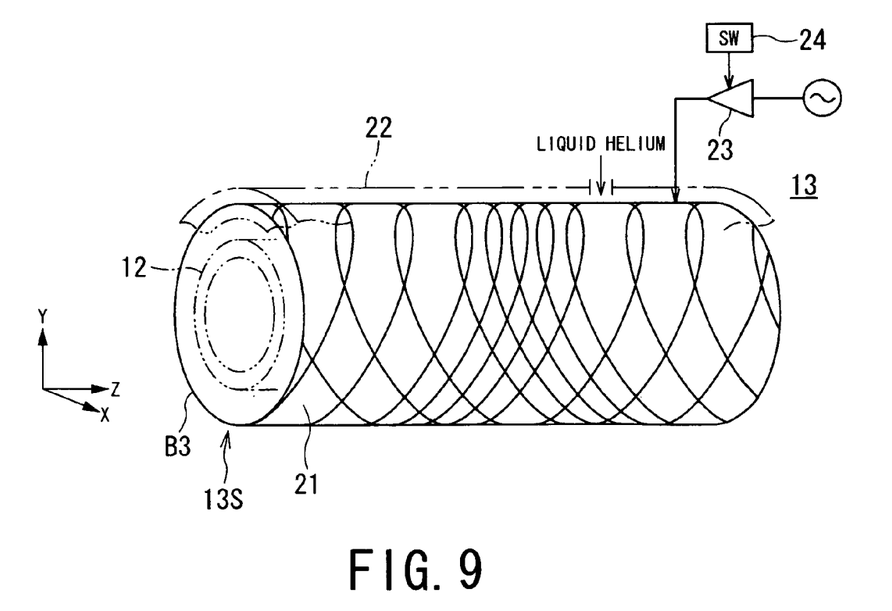
FIG. 9 is a schematic arrangement view explaining a shield coil according to other embodiment of the present invention.

A shield coil according to the embodiment is embodied as the shim coil unit 13 of a magnetic resonance imaging apparatus.

As shown in FIG. 9, the shim coil unit 13 includes a shield coil 13S having a mesh structure like the shield coil 12S shown in, for example, FIG. 5 described above. The shield coil 13S further includes a current supply circuit 23 that can be turned on and off and a switch 24 for turning on and off the current supply circuit 23. Accordingly, when the current supply circuit 23 is turned on by manipulating the switch 24, a current is supplied to the shield coil 13S, and the coil 13S is heated thereby.

When the shield coil according to the present invention is embodied as the shim coil as in the embodiment, the shield coil must shield not only the gradient magnetic fields G, which are varied dynamically as described above, but also the static magnetic field. For this purpose, the timing at which a static magnetic field is applied and the shield coil 13S is shifted to a superconducting state is important like in the embodiment described above. Although the shield coil 12S must be shifted to the superconducting state after the static magnetic field is applied in the embodiment described above, the sequence is inverted in this other embodiment.

A specific example of the other embodiment is as shown below. It is assumed here that the shield coil 13S is already in the superconducting state by filling a vessel 22 with liquid helium (at the time, a static field coil 11 is not yet started). In this state, a current is supplied from the current supply circuit 23 to the shield coil 13S by manipulating the switch 24. With this operation, since the shield coil 13S is heated by Joule heat, the shield coil 13S is instantly returned to a normal conducting state.

The current supplied from the current circuit 23 to the shield coil 13S is stopped by manipulating the switch 24 after the shield coil 13S is securely returned to the normal conducting state once as described above. As a result, the shield coil 13S, which is dipped into the liquid helium in the vessel 22, is shifted to the superconducting state again.

Next, the static magnetic field is generated by starting the static field coil unit 11. With this operation, the magnetic flux of the static magnetic field $B_0$ cannot pass through the shield coil 13S which is already placed in the superconducting state, and further the magnetic flux of the gradient magnetic fields G cannot also pass through the shield coil 13S. That is, both of them are shielded by the shield coil 13S.

When the shield coil 13S as described above is disposed, a shimming effect can be obtained by shielding the static magnetic field $B_0$ in addition to the effect of shielding the gradient magnetic fields G.

Note that the gradient coil unit 12 (the shield coil 12S) described above and the shim coil unit 13 (the shield coil 13S) may be used together.

Further, although the plurality of approximately diamond-shaped hole portions 21B are formed using the superconducting wire 21 in the shield coil 12S described above, the shape of the hole portions 21B is not always limited thereto basically.

That is, it is sufficient that the superconducting material is not distributed on the entire surface of the shield coil as the broadest concept of the hole portions, and further it is sufficient for the magnetic flux of the static electric field to pass through a plurality of finite- or infinitesimal-shaped hole portions. A mode for forming finite-shaped hole portions includes forming mesh-like hole portions.

Figure 10A:
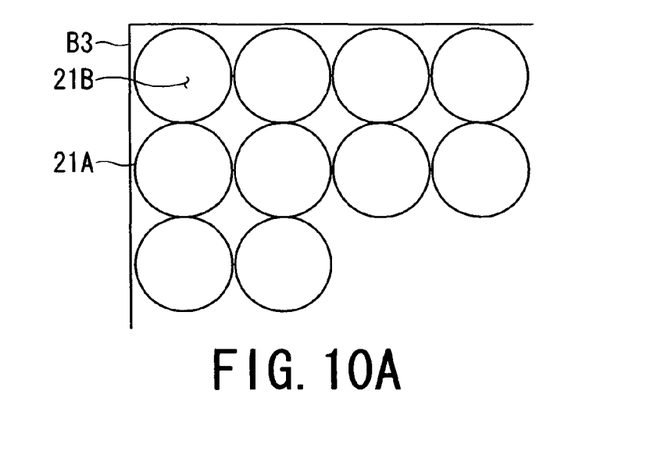
FIGS. 10A-10C are respectively a view explaining a modification of the shield coil and hole portions of the shield coil.
Figure 10B:
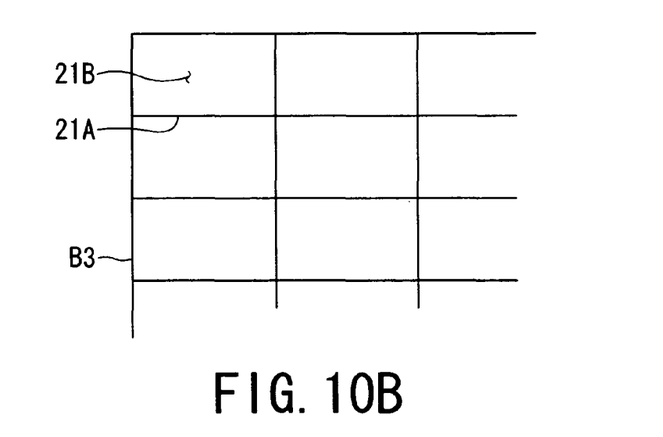
Figure 10C:
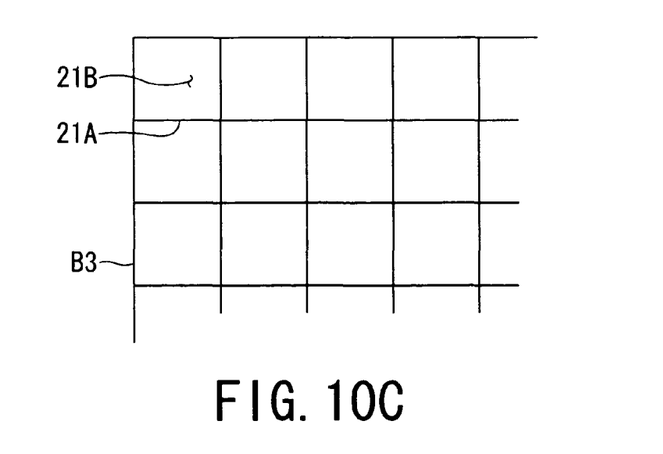

The finite-shaped hole portions 21B are not always limited to a diamond shape and may be a circular shape, a slot shape, and a square shape as shown in FIGS. 10A-10C and further may be any shape of an oval shape, the slot shape, the diamond shape, and the like. Each of the hole portions 21B functions as a small closed-loop coil and can shield a magnetic flux that attempts to enter the coil. In, for example, circular hole portions 21B as shown in FIG. 10A, a plurality of small loop coils are made using a wire such as a NbTi wire and the like, and the shield coil 12S can be formed by disposing the loop coils on the peripheral surface of a bobbin in a state that they are coupled with each other.

Further, even if the hole portions 21B have the same finite shape, the sizes thereof may be adjusted according to the positions of the cylindrical shield coil 12S (13S). For example, as schematically shown in FIG. 5, the size of the hole portions 21B may be formed fine in the central portion of the shield coil 12S in the cylindrical axis (Z-axis) direction thereof and may be formed coarse toward the edges of the shield coil 12S along the cylindrical axis direction conversely. With this arrangement, the shield performance of the shield coil 12S can be adjusted depending on the importance of a position in such a manner that the shield performance is more improved at a position nearer to the central portion.

Further, even a shield coil having such a structure that a plurality of small coils are formed of a superconducting material through a normal conducting substance can exhibit the same shield effect. In this case, however, since a problem arises in a quench phenomenon caused by heat generation, it is preferable to form a coil by distributing the superconducting material linearly.

The shield coils according to the embodiments and the modification described above may be formed to a multi-layer structure having at least one layer. The shield coils according to the embodiments and the modification described above may be disposed to the same vacuum layer as the static field coil for generating the static magnetic field or may be disposed to a different independent vacuum layer.

The gradient coils of the embodiments described above may be formed as a so-called self-shield type gradient coil (as an example, Actively Shielded Gradient Coil (ASGC)), and the shield coil described above may be applied thereto. The shield coil according to the present invention may be embodied as a non-shield type gradient coil. Further, at least one shield coil according to the present invention may be disposed to the outside of the gradient coil to partially shield the gradient coil.

The present invention is not limited to the embodiments and the modification thereof described above, and persons skilled in the art can embody the present invention by variously modifying it using conventionally known technologies within the scope which does not depart from the gist of the appended claims, and these modifications also belong to the scope of the present invention.

What is claimed is:

1. A shim coil unit arranged between an MRI static magnetic field generating unit and an MRI gradient magnetic field coil unit arranged on an inner circumferential side of the static magnetic field generating unit, said shim coil unit comprising:
a coil body formed of a portion including a superconducting material with an array of interruptions therein and closed paths about such interruptions, which superconducting material is changed from a non-superconducting state into a superconducting state before initiating generation of the static magnetic field in order to shield magnetic flux from the gradient magnetic field coil unit.

2. The shim coil unit according to claim 1, wherein the coil body combines functions to respectively shield leaks to an outer circumferential side of the magnetic flux of the gradient magnetic field generated by the gradient coil unit corresponding to X-channel, magnetic flux of the gradient magnetic field generated by the gradient coil unit corresponding to Y-channel, and magnetic flux of the gradient magnetic field generated by the gradient coil unit corresponding to Z-channel.

3. The shim coil unit according to claim 1, wherein the coil body has a shape that does not depend on a coil pattern of the gradient magnetic field coils.

4. The shim coil unit according to claim 1, wherein the coil body has a mesh-shaped cylindrical body, wherein the superconducting material forms closed loops of superconducting material.

5. The shim coil unit according to claim 1, wherein at least one coil body is arranged so as to partially shield gradient magnetic flux generated by the gradient coil unit.

6. The shim coil unit according to claim 1, wherein the coil body is formed by one-layer structure or a multi-layer structure.

7. The shim coil unit according to claim 1, wherein the interruptions in the superconducting material are portions comprising a lattice defect of the superconducting material.

8. The shim coil unit according to claim 1, wherein the coil body is formed in a sheet having a predetermined thickness.

9. The shim coil unit according to claim 8, wherein the superconducting material includes a plurality of apertures disposed within the sheet.

10. The shim coil unit according to claim 9, wherein the apertures form a mesh shape.

11. The shim coil unit according to claim 10, wherein said apertures are in one of a plurality of shapes including: a circular shape, an oval shape, a slot shape, a rectangular shape and a diamond shape.

12. The shim coil unit according to claim 9, wherein the superconducting material is formed as a plurality of loop coils coupled mutually onto the peripheral surface of a cylinder.

13. A method of driving a magnetic resonance imaging apparatus including the shim coil unit according to claim 1, said method comprising:
a step of changing a state of the shim coil unit superconducting material into a superconducting state; and
thereafter initiating generation of the static magnetic field in order to shield gradient magnetic flux after the changing step.

14. A magnetic resonance imaging apparatus comprising:
a static magnetic field generating unit configured to generate a static magnetic field into an inner circumferential side of the static magnetic field generating unit;
a shim coil unit arranged between the gradient coil unit and the static magnetic field generating unit and configured to make more uniform the static magnetic field generated by the static magnetic field generating unit; and
a gradient coil unit arranged at an inner circumferential side of the static magnetic field generating unit and configured to generate gradient magnetic fields;
wherein a coil body of the shim coil unit is formed of a portion including a superconducting material but which superconducting material which has closed interruptions distributed therewithin and which is changed into a superconducting state before initiating the generation of the static magnetic field in order to shield gradient magnetic flux from the gradient coil unit.

15. The magnetic resonance imaging apparatus according to claim 14, wherein the coil body combines functions to respectively shield leaks to an outer circumferential side of magnetic flux of the gradient magnetic field generated by the gradient coil unit corresponding to X-channel, magnetic flux of the gradient magnetic field generated by the gradient coil unit corresponding to Y-channel, and magnetic flux of the gradient magnetic field generated by the gradient coil unit corresponding to Z-channel.

16. The magnetic resonance imaging apparatus according to claim 14, wherein the coil body assists in equalizing the static magnetic field.

17. A passive type shield coil, disposed in a magnetic resonance imaging apparatus, for shielding gradient magnetic field flux generated at an inner circumferential side by a gradient coil unit, said passive type shield coil being set at an outer circumferential side of the gradient coil unit and comprising:
a coil body formed of a portion including a superconducting material having closed areas distributed therewithin that are non-superconducting,
wherein the non-superconducting areas comprise lattice defects of the superconducting material.

18. A passive type shield coil, disposed in a magnetic resonance imaging apparatus, for shielding gradient magnetic field flux generated at an inner circumferential side by a gradient coil unit, said passive type shield coil being set at an outer circumferential side of the gradient coil unit and comprising:
a coil body formed of a portion including a superconducting material having closed areas distributed therewithin that are non-superconducting,
wherein the coil body is formed in a sheet having a predetermined thickness and the non-superconducting areas comprise a plurality of holes disposed in the coil body sheet.

19. An MRI system comprising:
a static magnetic field generating unit configured to generate a static magnetic field $B_o$ aligned with a Z-axis of the MRI system;
a gradient magnetic field generating unit configured to generate $G_x$, $G_y$ and $G_z$ gradient field pulses when driven by respective current pulses during an MRI data acquisition process;
a passive superconducting gradient shield coil disposed between said static and gradient magnetic field generating units;
said passive superconducting gradient shield coil comprising a plurality of inter-connected closed paths of superconducting material defining apertures therewithin between said inter-connected closed paths, said apertures providing respective self-contained closed paths for the flow thereabout of induced electrical currents; and means for selectively changing the superconducting state of the passive gradient shield coil material with respect to the initiation of said static magnetic field $B_o$ is initiated, thereby creating conditions which permit the static field to pass through the shield coil while gradient fields are suppressed from doing so.

20. The MRI system of claim 19, wherein the gradient shield coil structure is configured non-uniformly so as to act as a shim coil that improves uniformity of said static magnetic field $B_o$ within an imaged volume.

* * * * *